(12) United States Patent
Liu et al.

(10) Patent No.: US 12,150,281 B1
(45) Date of Patent: Nov. 19, 2024

(54) HEIGHT-ADJUSTABLE SERVER AIR GUIDE HOOD AND SERVER

(71) Applicant: SUZHOU METABRAIN INTELLIGENT TECHNOLOGY CO., LTD., Jiangsu (CN)

(72) Inventors: Liqiang Liu, Jiangsu (CN); Wenfang Li, Jiangsu (CN); Yaoyang Liu, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/725,013

(22) PCT Filed: Jan. 12, 2023

(86) PCT No.: PCT/CN2023/071945
§ 371 (c)(1),
(2) Date: Jun. 27, 2024

(87) PCT Pub. No.: WO2024/036882
PCT Pub. Date: Feb. 22, 2024

(30) Foreign Application Priority Data

Aug. 17, 2022 (CN) .......................... 202210984626.5

(51) Int. Cl.
*H05K 7/20* (2006.01)
*G06F 1/20* (2006.01)

(52) U.S. Cl.
CPC ..... *H05K 7/20727* (2013.01); *H05K 7/20145* (2013.01)

(58) Field of Classification Search
CPC ... H05K 7/20145; H05K 7/20727; G06F 1/20
See application file for complete search history.

(56) References Cited

U.S. PATENT DOCUMENTS

| | | | |
|---|---|---|---|
| 9,036,344 B2* | 5/2015 | Chen ......................... | G06F 1/20 |
| | | | 174/15.1 |
| 11,252,843 B2* | 2/2022 | Ni ........................... | F28F 13/06 |

(Continued)

FOREIGN PATENT DOCUMENTS

| | | |
|---|---|---|
| CN | 106323663 A | 1/2017 |
| CN | 206193613 A | 5/2017 |

(Continued)

OTHER PUBLICATIONS

Corresponding International Patent Application No. PCT/CN2023/071945, International Search Report, Date Mailed Apr. 28, 2023.

(Continued)

*Primary Examiner* — Zachary Pape
(74) *Attorney, Agent, or Firm* — Cooper Legal Group, LLC

(57) ABSTRACT

The air guide hood includes: an air guide hood body arranged with slideways, each slideway including a first and a second operation position; left and right side plates, where each of the left and right side plates has a side slidably provided in a corresponding slideway and rotates to the body; when fixed in the first operation positions, the left and right side plates are provided opposite to each other and are both perpendicular to the body; when detached from the first operation positions and rotated to the second operation positions, the left and right side plates are both attached to the body; and top plates, where two sides of the top plate are rotatably connected to the top of the left and the right side plates so that the top plate is supported by the left and right side plates and is higher than the body.

20 Claims, 5 Drawing Sheets

(56) References Cited

U.S. PATENT DOCUMENTS

2010/0026916 A1    2/2010  Lin
2013/0029584 A1*  1/2013  Chan .................. H05K 7/20145
                                                                    454/367

FOREIGN PATENT DOCUMENTS

| CN | 107491152 A | | 12/2017 |
|---|---|---|---|
| CN | 211742032 A | | 10/2020 |
| CN | 112684862 A | | 4/2021 |
| CN | 113867493 A | | 12/2021 |
| CN | 114326957 A | | 4/2022 |
| CN | 114721484 A | * | 7/2022 |
| CN | 115061557 A | | 9/2022 |

OTHER PUBLICATIONS

Corresponding International Patent Application No. PCT/CN2023/071945, Written Opinion, Date Mailed Apr. 28, 2023.
Corresponding Chinese Patent Application No. CN202210984626.5, First Office Action dated Sep. 26, 2022.
Corresponding Chinese Patent Application No. CN202210984626.5, Notification of Grant dated Oct. 11, 2022.

* cited by examiner

HEIGHT-ADJUSTABLE SERVER AIR GUIDE HOOD AND SERVER

CROSS-REFERENCE TO RELATED APPLICATIONS

This application claims priority to Chinese Patent Application 202210984626.5, entitled "HEIGHT-ADJUSTABLE SERVER AIR GUIDE HOOD AND SERVER", filed to China National Intellectual Property Administration on Aug. 17, 2022, the entire contents of which are incorporated herein by reference.

FIELD

The present application relates to a technical field of server design, and particularly to a height-adjustable server air guide hood. Furthermore, the present application also relates to a server including the height-adjustable server air guide hood above-mentioned.

BACKGROUND

Low power consumption and high heat dissipation are pursuit requirements of servers. Servers with excellent heat dissipation performance may effectively prevent a fatal defect of system crashes caused by poor heat dissipation of high-power components such as CPUs (Central Processing Units) and GPUs (Graphics Processing Units).

In the related art, in order to better control a wind direction in a server, an air guide hood is generally provided for controlling the wind direction and air volume, and a good heat dissipation requirement of the server is largely satisfied using the air guide hood.

In servers where high heat-generating CPUs are located, the air volume is usually increased accordingly. In order to meet heat dissipation requirements of different configurations and different 1 U/2 U (1 Unit/2 Unit) models, different specifications of air guide hoods need to be designed and installed separately. Therefore, the air guide hoods at different positions in the server are generally not universal, and various types of air guide hoods result in complicated design steps, increased overall cost, and complicated control and maintenance methods.

In summary, the present application focuses on how to provide an air guide hood that may adapt to different models.

SUMMARY

In view of this, some embodiments of the present application provide a height-adjustable server air guide hood. Under a condition that the air guide hood is adapted to radiators with different heights, members at heating parts are adjusted to adapt to radiators with different requirements without replacing the air guide hood which may be applied to different models, thereby facilitating quick replacement and reducing cost consumption.

Other embodiments of the present application provide a server including the above-mentioned height-adjustable server air guide hood.

In order to achieve the above-mentioned object, the present application provides the following technical solutions.

A height-adjustable server air guide hood is provided, including:

an air guide hood body arranged with at least two sets of slideways, each set of slideways including a first operation position and a second operation position;

a left side plate and a right side plate, where one side edge of both the left side plate and the right side plate is disposed in a corresponding slideway; under a condition that the left side plate and the right side plate are fixed in the first operation positions, the two are disposed opposite to each other and are both perpendicular to the air guide hood body; under a condition that the left side plate and the right side plate are detached from the first operation positions and rotated to the second operation positions, the two are both attached to the air guide hood body; and a top plate, where two sides of the top plate are rotatably connected to a top of the left side plate and a top of the right side plate correspondingly so that the top plate is supported by the left side plate and the right side plate and is higher than the air guide hood body.

In one embodiment, the left side plate is provided with two left-side convex pins, and the two left-side convex pins are located in one set of slideways; and/or the right side plate is provided with two right-side convex pins, and the two right-side convex pins are located in another set of slideways; two sets of slideways are arranged in parallel.

In one embodiment, an inner side of the slideway is provided with an elongated side wall at a non-second operation position to limit the rotation of the left side plate and the right side plate relative to the air guide hood body at the non-second operation position.

In one embodiment, the left-side convex pin and/or the right-side convex pin are of flat structures: a width of the slideway at the second operation position is greater than or equal to a maximum width of the flat structure, and a width of the slideway at a non-second operation position is less than the maximum width of the flat structure.

In one embodiment, one of the air guide hood body and the left side plate is provided with a left-side convex point, and the other is arranged with a left-side concave hole: under a condition that the left side plate moves to a corresponding first operation position, the left-side convex point is inserted into the left-side concave holes to limit the rotation and sliding of the left side plate; and/or one of the air guide hood body and the right side plate is provided with a right-side convex point, and the other is arranged with a right-side concave hole; under a condition that the right side plate moves to a corresponding first operation position, the right-side convex point is inserted into the right-side concave holes to limit the rotation and sliding of the right side plate.

In one embodiment, there are at least two left-side convex points and at least two left-side concave holes; and/or there are at least two right-side convex points and at least two right-side concave holes.

In one embodiment, one of the air guide hood body and the left side plate is arranged with left-side pits, and the other is provided with left-side bosses configured to be clamped with the left-side pits: under a condition that the left side plate is located at a corresponding second operation position, the left-side pit is clamped with the left-side boss to limit sliding of the left side plate; and/or one of the air guide hood body and the right side plate is arranged with right-side pits, and the other is provided with right-side bosses configured to be clamped with a right-side pit; under a condition that the right side plate is located at a corresponding second operation position, the right-side pit is clamped with the right-side bosses to limit the sliding of the right side plate.

In one embodiment, there are at least two left-side pits and at least two left-side bosses; and/or there are at least two right-side pits and at least two right-side bosses.

In one embodiment, the top plate includes:

a left top plate, where the left side plate is rotatably inserted into a left end of the left top plate, and the left top plate and the left side plate are provided perpendicular to each other in an inserted state; and a right top plate, where a right end of the left top plate is inserted into a left end of the right top plate, and the right side plate is rotatably inserted into a right end of the right top plate.

In one embodiment, the left side plate is detachably rotatably inserted into the left top plate, the left top plate is detachably inserted into the right top plate, and the right side plate is detachably rotatably inserted into the right top plate.

In one embodiment, the right top plate is provided with a connecting rod which is rotatable; a movable end of the connecting rod is provided with a telescopic pin; the right side plate is arranged with a first positioning hole, and the telescopic pin is able to telescope relative to the connecting rod and is inserted into the first positioning hole to fix the right side plate and the right top plate.

In one embodiment, the right top plate is arranged with a second positioning hole; the connecting rod is rotated to the second positioning hole, and the telescopic pin is inserted into the second positioning hole.

In one embodiment, both the left side plate and the right side plate are provided with a hand-held structure.

In one embodiment, the air guide hood body is provided with at least two left side plates, at least two right side plates, and at least two top plates.

A server is provided, including an air guide hood, the air guide hood being the height-adjustable server air guide hood as mentioned above.

Under a condition that the left side plate and the right side plate are located at the first operation positions, the two side plates are both perpendicular to the air guide hood body and are in opposite positions. The two side plates may be configured to support the top plate and form a supporting part of the top plate. The top plate may be connected to the left side plate and the right side plate so that the left side plate, the top plate, and the right side plate are connected in sequence. A heat dissipation device such as a radiator may be placed on the top plate. Since the heat dissipation device is placed at a position higher than the air guide hood body, a height of the heat dissipation device is relatively high, making the heat dissipation device applicable to a large-sized server.

In the process that the left side plate and the right side plate are detached from the first operation positions and are rotated to the second operation positions, the two side plates may be rotated relative to the air guide hood body and are rotated to a state where the left side plate and the right side plate are both attached to the air guide hood body, forming the retracting of the left side plate and the right side plate. Since the overall structure is planarized after adjustment, the heat dissipation device may be placed at a lower position so that an operation position range of the heat dissipation device is lower than that of the previous operation state, which is more applicable to a small-sized server.

In the above-mentioned air guide hood structure, a bridge-like structure may be formed through the adjustable top plate, the left side plate, and the right side plate so that the height of the heat dissipation device may be adjusted. The height of the structure configured to support the heat dissipation device may be changed through a simple operation during use, thereby adapting to different types of servers. Under a condition that the height-adjustable air guide hood provided in the present application is adapted to radiators with different heights, the top plate, the left side plate, and the right side plate are adjusted without replacing the air guide hood, thereby reducing the cost.

In a further solution, one of the air guide hood body and the left side plate is arranged with the left-side pits, and the other is provided with the left-side bosses. Positions of the left-side pits and the left-side bosses are matched, i.e., under a condition that the left side plate is rotated to attach to the air guide hood body, the left-side pits and the left-side bosses are inserted or clamped, and a limiting direction thereof is to limit the movement of the left side plate along the direction of the slideway. Similarly, the right-side pits and the right-side bosses are inserted or clamped to limit the movement of the right side plate along the direction of the slideway. The stability of the apparatus may be increased by such an arrangement.

In addition, the positioning apparatuses are provided and configured to fix the angle between the top plate and the side plate to maintain stability.

The present application also provides a server including the above-mentioned height-adjustable server air guide hood. Since the server has the above-mentioned height-adjustable server air guide hood, it may adjust the server air guide hood according to a height of the current server when used, thereby achieving a better heat dissipation effect.

BRIEF DESCRIPTION OF THE DRAWINGS

In order to explain embodiments of the present application or the technical solutions in the related art more clearly, the following will briefly introduce the drawings which need to be used in the description of the embodiments or the related art. Obviously, the drawings in the description below are merely some embodiments of the present application, and for a person skilled in the art, other drawings may also be obtained according to these drawings without involving any inventive effort.

In FIGS. 1-10, reference symbols include:

1, air guide hood body; 101, left-side slideway; 102, left-side pit; 103, left-side concave hole; 104, right-side slideway; 105, right-side pit;

2, left side plate; 201, left-side convex pin; 202, left-side hand-held structure; 203, left-side boss; 204, left-side convex point;

3, left top plate;

4, right top plate; 401, second positioning hole;

5, right side plate; 501, right-side convex pin; 502, right-side hand-held structure; 503, right-side boss; 504, first positioning hole;

6, positioning apparatus; 601, telescopic pin; 602, connecting rod; and 603, screw.

DETAILED DESCRIPTION

The technical solutions in these embodiments of the present application will be clearly and completely described below in conjunction with the accompanying drawings in these embodiments of the present application. Obviously, the described embodiments are some embodiments of the present application, not all embodiments. On the basis of these embodiments in the present application, all the other embodiments obtained by a person skilled in the art without involving any inventive effort fall within the scope of the present application.

A core of the present application is to provide a height-adjustable server air guide hood. Under a condition that the air guide hood is adapted to radiators with different heights, members at heating parts are adjusted to adapt to radiators with different requirements without replacing the air guide hood which may be applied to different models, thereby facilitating quick replacement and reducing cost consumption.

Another core of the present application is to provide a server including the above-mentioned height-adjustable server air guide hood.

Figure 1:
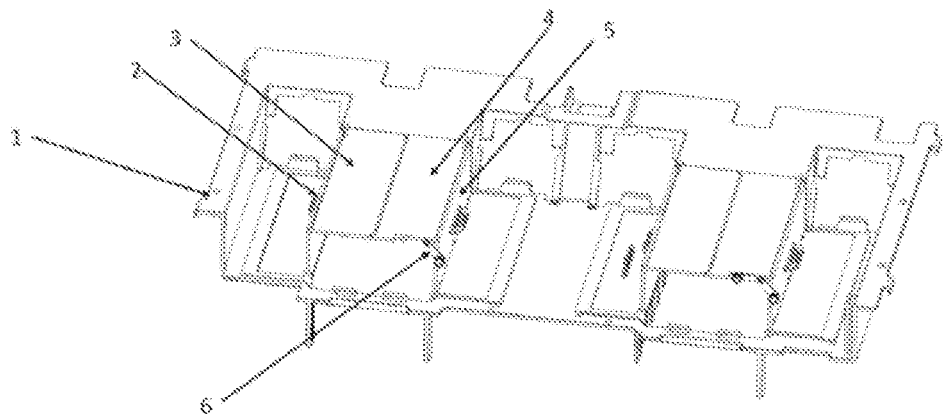
FIG. 1 is a schematic diagram of a height-adjustable server air guide hood provided in the present application.
Figure 2:
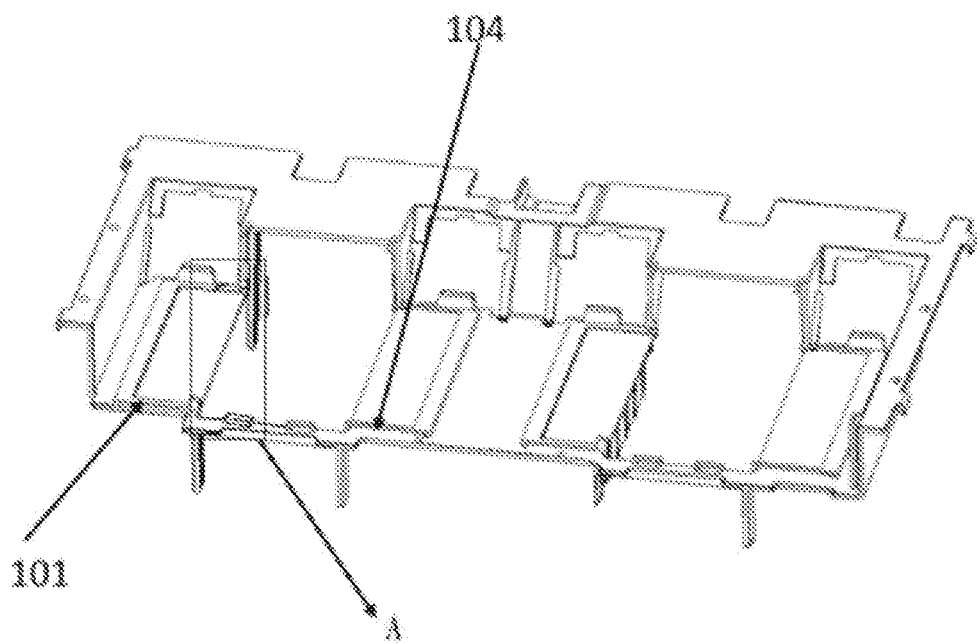
FIG. 2 is a schematic structural diagram of an air guide hood body provided in the present application.
Figure 3:
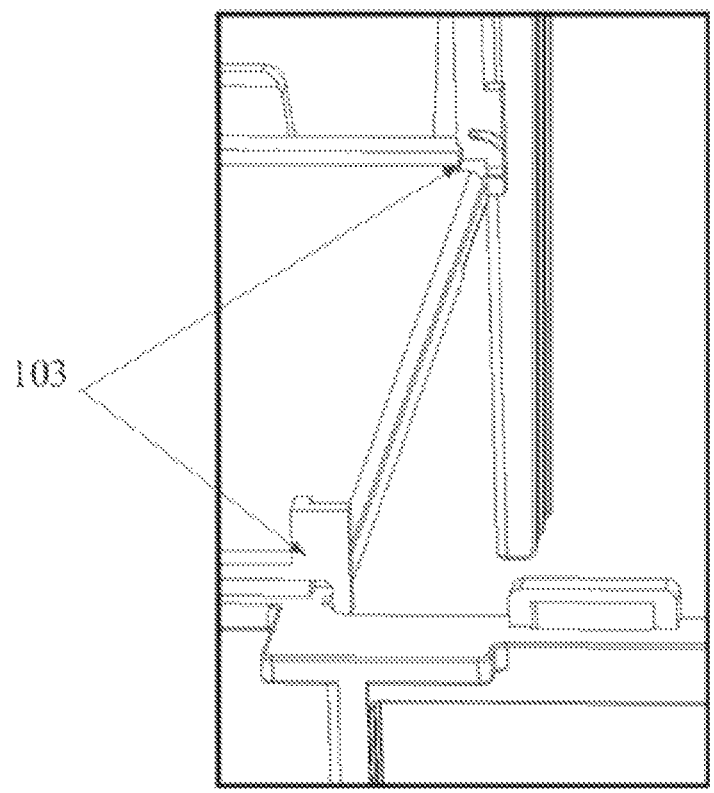
FIG. 3 is an enlarged schematic diagram of a position A in FIG. 2.
Figure 4:
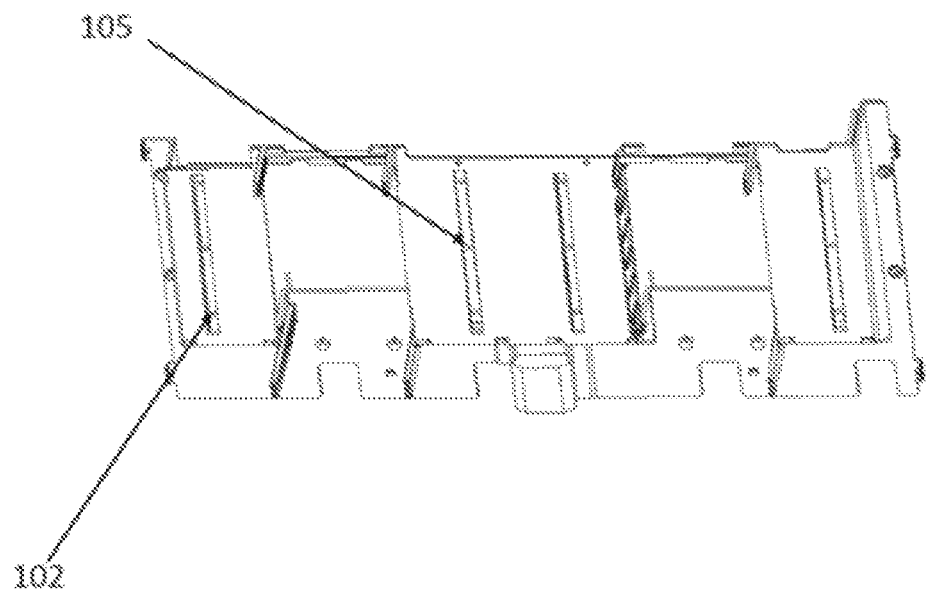
FIG. 4 is a schematic diagram of a reverse side of the air guide hood body provided in the present application.
Figure 5:
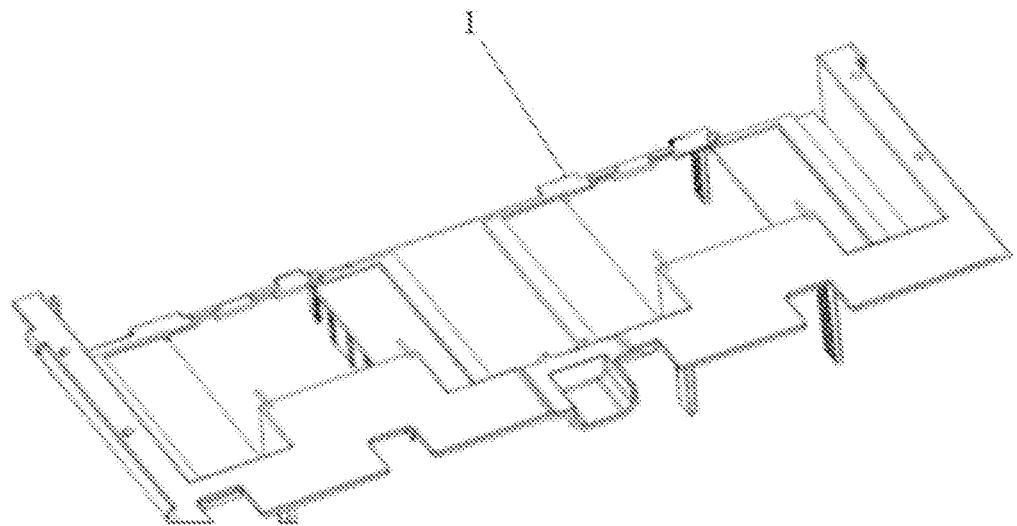
FIG. 5 is a schematic diagram of a front side of the air guide hood body provided in the present application.
Figure 6:
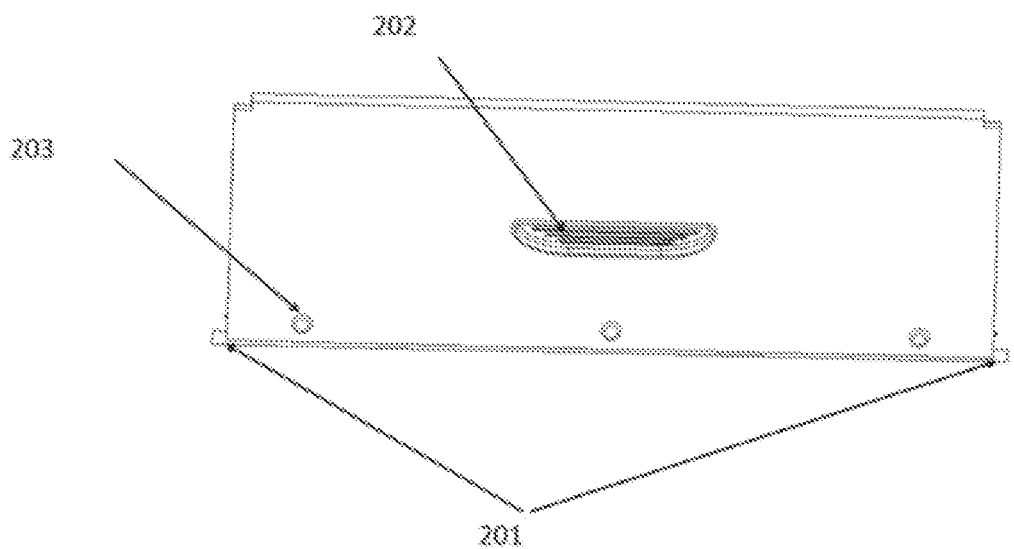
FIG. 6 is a schematic structural diagram of a left side plate provided in the present application.
Figure 7:
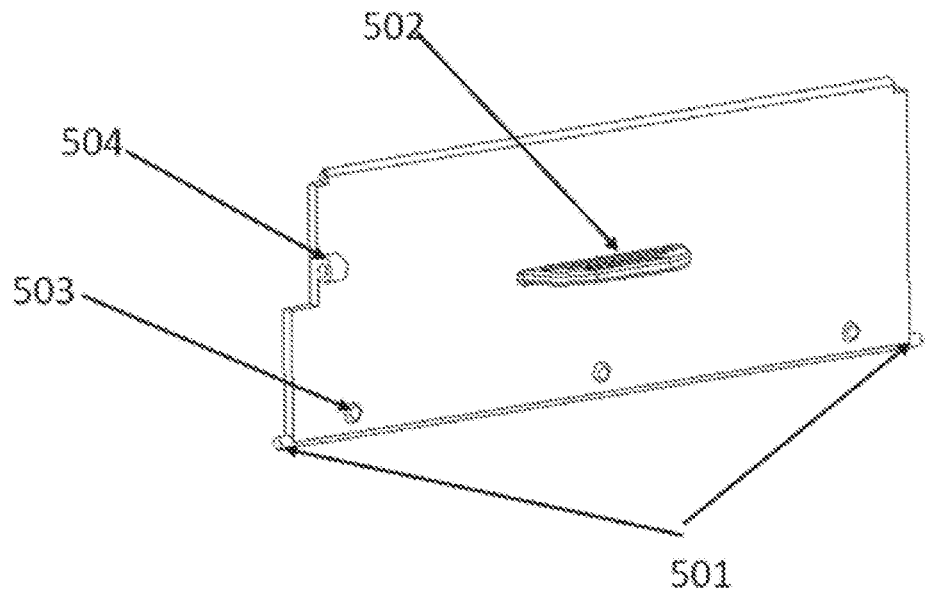
FIG. 7 is a schematic structural diagram of a right side plate provided in the present application.
Figure 8:
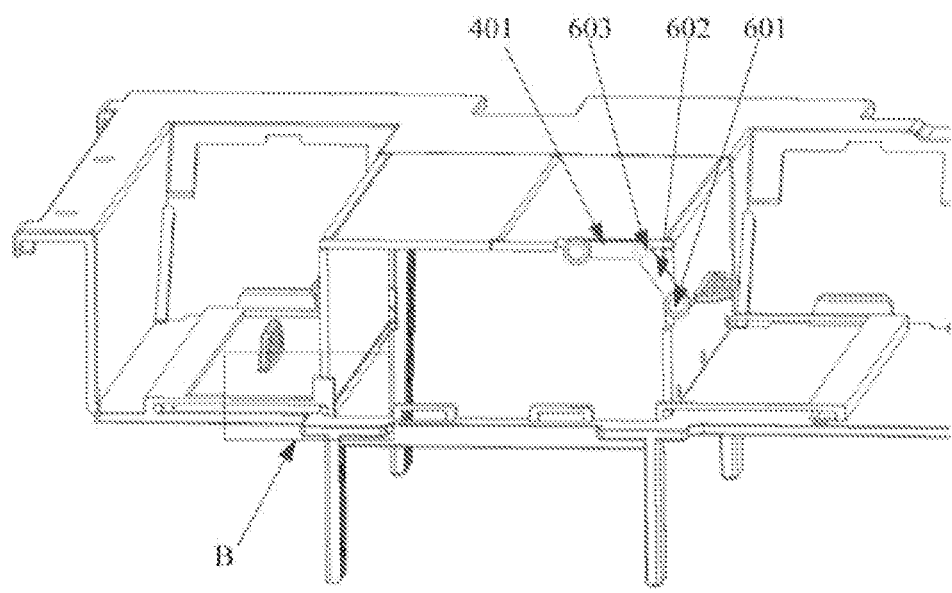
FIG. 8 is a schematic structural diagram of the height-adjustable server air guide hood for a 2 U server.
Figure 9:
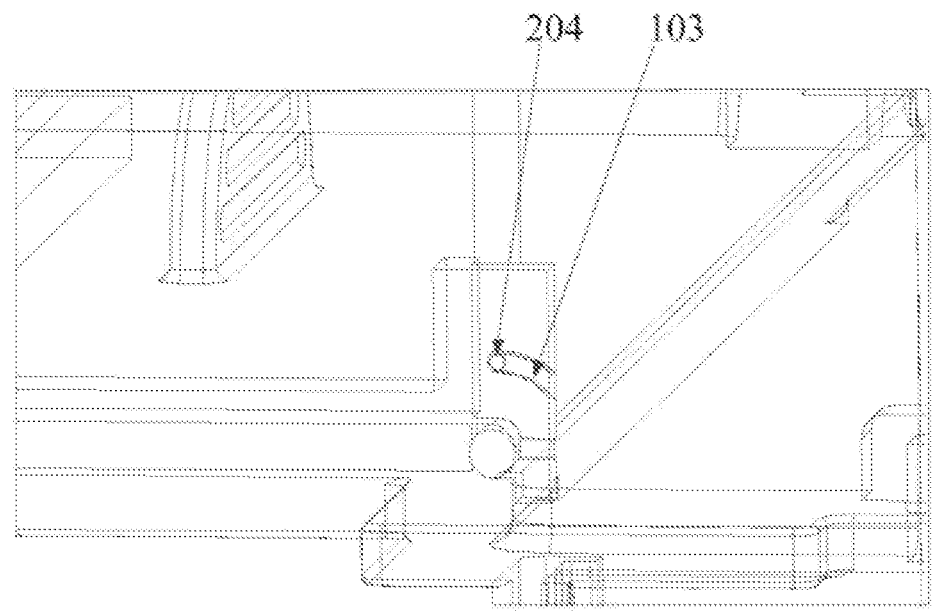
FIG. 9 is an enlarged partial view of a position B in FIG. 8.
Figure 10:
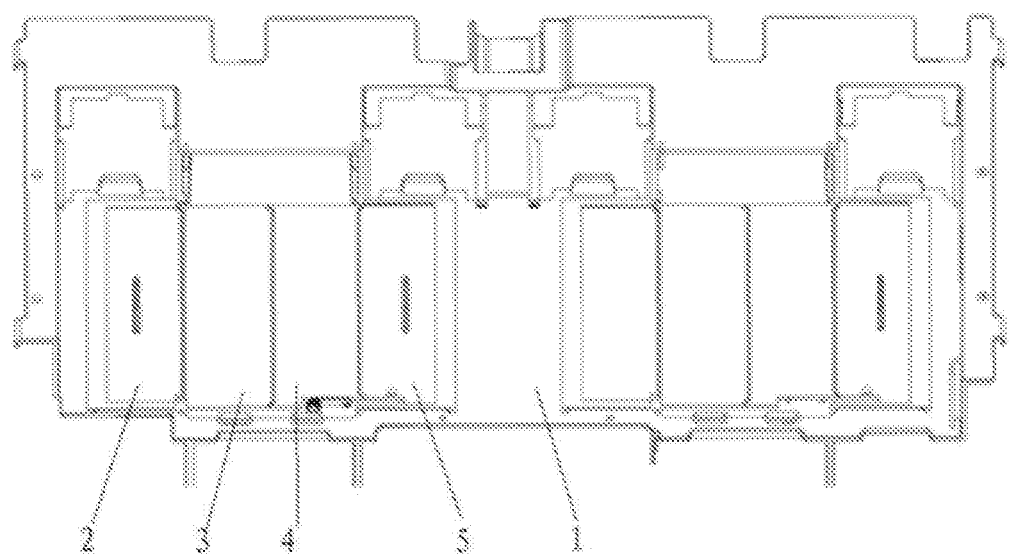
FIG. 10 is a top view of the height-adjustable server air guide hood.

Referring to FIGS. 1 to 10, FIG. 1 is a schematic diagram of the height-adjustable server air guide hood provided in the present application. FIG. 2 is a schematic structural diagram of the air guide hood body provided in the present application. FIG. 3 is an enlarged schematic diagram of a position A in FIG. 2. FIG. 4 is a schematic diagram of a reverse side of the air guide hood body provided in the present application. FIG. 5 is a schematic diagram of a front side of the air guide hood body provided in the present application. FIG. 6 is a schematic structural diagram of a left side plate provided in the present application. FIG. 7 is a schematic structural diagram of a right side plate provided in the present application. FIG. 8 is a schematic structural diagram of the height-adjustable server air guide hood for a 2 U server. FIG. 9 is an enlarged partial view of a position B in FIG. 8. and FIG. 10 is a top view of the height-adjustable server air guide hood.

The present application provides the height-adjustable server air guide hood, including: the air guide hood body 1, a top plate, a left side plate 2, and a right side plate 5. The air guide hood body 1 is arranged with at least two sets of slideways, and each set of slideways includes a first operation position and a second operation position. Both the left side plate 2 and the right side plate 5 has a side slidably provided in a corresponding slideway and may be rotated relative to the air guide hood body 1 at a partial position. Under a condition that the left side plate 2 and the right side plate 5 are fixed in first operation positions of the corresponding slideways, the two are provided opposite to each other and are both perpendicular to the air guide hood body 1. Under a condition that the left side plate 2 and the right side plate 5 are detached from the first operation positions and rotated to the second operation positions of the corresponding slideways, the two are both attached to the air guide hood body 1. Two sides of the top plate are rotatably connected to a top of the left side plate 2 and a top of the right side plate 5 correspondingly so that the top plate is supported by the left side plate 2 and the right side plate 5 and is higher than the air guide hood body 1.

It should be noted that the air guide hood body 1 may be of a plate-like structure or a block-like structure, and its main function is to form a structure for installing a radiator. The above-mentioned air guide hood body 1 may be configured directly to place the radiator or to place the radiator on a formed bridge-like structure.

The air guide hood body 1 is arranged with slideways configured to serve as sliding guide limiting structures for the left side plate 2 and the right side plate 5. The slideway may be a single-track slideway or a double-track slideway. In some embodiments, the slideway includes a left-side slideway 101 and a right-side slideway 104, which may be single-track slideways or double-track slideways. The left side plate 2 and the right side plate 5 are provided in corresponding slideways. The slideway may also be a single integral slideway, and the left side plate 2 and the right side plate 5 slide in different sections of the same slideway.

The left side plate 2 and the right side plate 5 are both of plate-like structures and may slide and move in the slideways. In practice, it is usually provided that the left side plate 2 moves in the left-side slideway 101, and the right side plate 5 moves in the right-side slideway 104. A space formed between the two slideways may be used for placing a top plate or used as other functional positions.

The left side plate 2 and the right side plate 5 moving on the slideways may be moved to at least two operation positions, including the first operation position and the second operation position. Under a condition that located at different operation positions, the left side plate 2 and the right side plate 5 are in different operation states.

Under a condition that the left side plate 2 and the right side plate 5 are fixed in the first operation positions, the two side plates are both perpendicular to the air guide hood body 1 and are in opposite positions. The two side plates may form a supporting part of a bridge-like structure. The top plate may be connected to the left side plate 2 and the right side plate 5 so that the left side plate 2, the top plate, and the right side plate 5 are connected in sequence to form the bridge-like structure. The bridge structure may be configured to place a heat dissipation device such as a radiator. Since the heat dissipation device is placed on the bridge-like structure, a height of the heat dissipation device is relatively high, making the heat dissipation device applicable to a large-sized server, such as a 2 U server. The bridge-like structure mentioned in the present application is that the left side plate 2 and the right side plate 5 serve as supporting column structures of the bridge, and the top plate serves as a span structure of the bridge.

In some embodiments, the first operation position may be a groove perpendicular to the slideway. The left side plate 2 and the right side plate 5 may be rotated to insert part of their structures into the groove under a condition that sliding to the groove so that both the left side plate 2 and the right side plate 5 are perpendicular to the air guide hood body for forming a support for the top plate. In some embodiments, other fixing apparatuses may also be provided at the first operation position and configured to fix the positions of the left side plate 2 and the right side plate 5.

Under a condition that the left side plate 2 and the right side plate 5 are detached from the first operation positions and are rotated to the second operation positions, the two side plates may be rotated relative to the air guide hood body 1 and are rotated to a state where plate surfaces are attached to the air guide hood body 1, forming the retracting of the left side plate 2 and the right side plate 5. The left side plate 2 and the right side plate 5 are moved to the second operation positions to form a retracting operation for the left side plate 2 and the right side plate 5. Since the overall structure is planarized after the structural adjustment, the heat dissipation device may be placed at a lower position so that an operation range of the heat dissipation device is lower than that of placing on the bridge-like structure, which is more applicable to a small-sized server, such as a 1 U server.

The above-mentioned large size, small size, 1 U, and 2 U are relative concepts, and are not limited to the above-mentioned sizes, but may also be 2 U and 4 U.

In the above-mentioned air guide hood structure, the bridge-like structure may be formed through adjustable top plate, left side plate 2, and right side plate 5 so that the height of the heat dissipation device may be adjusted. The height of the structure configured to support the heat dissipation device may be changed through a simple operation during use, thereby adapting to different types of servers. Under a condition that the height-adjustable air guide hood provided in the present application is adapted to radiators with different heights, the top plate, the left side plate 2, and the right side plate 5 are adjusted without replacing the air guide hood, thereby reducing the cost.

The above-mentioned that the left side plate 2 and the right side plate 5 are slidable and fixable in the first operation positions refers to that the left side plate 2 and the right side plate 5 may be slid to the first operation positions and fixed through a fixing apparatus, such as a clamping member or a limiting structure. A fixing structure in the related art may be selected to fix the left side plate 2 relative to the air guide hood body 1, and the fixing structure is a detachable structure so that the limiting of the left side plate 2 may be released by changing the state when necessary. Similarly, another fixing structure is provided and configured to fix the position of the right side plate 5.

The height-adjustable server air guide hood provided in the present application may achieve a height change and is simple to operate. However, since the operation manners and the fixing manners are various, it is not limited to how to achieve the above-mentioned state change. The state change may also be adjusted based on other fixing manners and operation manners in the related art.

The above-mentioned embodiment describes that the left side plate 2 and the right side plate 5 may move along the slideways, and the structure or manner thereof may have various forms.

On a basis of the above-mentioned embodiment, the left side plate 2 is provided with two left-side convex pins 201, and the two left-side convex pins 201 are located in one set of slideways, and/or the right side plate 5 is provided with two right-side convex pins 501, and the two right-side convex pins 501 are located in another set of slideways. Two sets of slideways are arranged in parallel.

It should be noted that the above-mentioned left-side convex pin 201 does not refer to that it is provided on the left side, and the above-mentioned right-side convex pin 501 does not refer to that it is provided on the right side.

It should be noted that two sides of the bottom of the left side plate 2 are provided with the left-side convex pins 201, respectively. The left-side convex pins 201 may protrude to lower parts or two sides and are correspondingly provided in the slideways, for example, a set of the left-side slideways 101. The left-side slideway 101 refers to a slideway con-figured to be matched with the left side plate 2 correspondingly, and is not limited to being positioned on the left side.

Two sides of the bottom of the right side plate 5 are provided with the right-side convex pins 501, respectively. The right-side convex pins 501 may protrude to lower parts or two sides and are correspondingly provided in the slideways, for example, a set of the right-side slideways 104. The right-side slideway 104 refers to a slideway configured to be matched with the right side plate 5 correspondingly, and is not limited to being positioned on the right side.

The left-side slideway 101 and the right-side slideway 104 are arranged in parallel so that the left side plate 2 and the right side plate 5 may be arranged opposite to each other. In some embodiments, the left side plate 2 and the right side plate 5 may be arranged in parallel.

The mode of adopting two left-side convex pins 201 and two right-side convex pins 501 to slide in the slideways may guarantee accuracy of sliding and avoid instability of sliding.

In some embodiments, a protrusion may be provided at a lower part of the left side plate 2, slideways may be arranged at a middle part of the air guide hood body 1, and the left side plate 2 may be rotated relative to the air guide hood body 1. Similarly, the right side plate 5 may be provided as well.

On the basis of the above-mentioned embodiments, an inner side of the slideway is provided with an elongated side wall at a non-second operation position to limit the rotation of the left side plate 2 and the right side plate 5 relative to the air guide hood body 1 at the non-second operation position.

In some embodiments, the left-side convex pin 201 and/or the right-side convex pin 501 are of flat structures. A width of the slideway at the second operation position is greater than or equal to a maximum width of the flat structure, and a width of the slideway at a non-second operation position is less than the maximum width of the flat structure.

It should be noted that the left-side convex pin 201 and/or the right-side convex pin 501 may be of structures with different lengths and widths, thereby controlling their abilities to rotate at different positions based on sizes of gaps between them and the slideways.

On the basis of any one of the above-mentioned embodiments, one of the air guide hood body 1 and the left side plate 2 is provided with left-side convex points 204, and the other is arranged with left-side concave holes 103. Under a condition that the left side plate 2 moves to the corresponding first operation position, the left-side convex points 204 are inserted into the left-side concave holes 103 to limit the rotation and sliding of the left side plate 2.

And/or one of the air guide hood body 1 and the right side plate 5 is provided with right-side convex points, and the other is arranged with right-side concave holes. Under a condition that the right side plate 5 moves to the corresponding first operation position, the right-side convex points are inserted into the right-side concave holes to limit the rotation and sliding of the right side plate 5.

It should be noted that the left-side convex points 204 may be provided on the air guide hood body 1, and under a condition that the left side plate 2 moves to the first operation position, the left-side convex points 204 are inserted into the left-side concave holes 103 to limit the rotation and sliding of the left side plate 2. In some embodiments, referring to FIG. 9, the left-side concave hole 103 is a slide-in groove on the air guide hood body 1 so that the left side plate 2 is limited to rotate from a vertical position to the left (to a position away from the top plate) and allowed to rotate from the vertical position to the right (to a position close to the top plate). For the right side plate, similarly, the right side plate 5 is limited to rotate from the vertical position to the left (to a position close to the top plate) and allowed to rotate from the vertical position to the right (to a position away from the top plate). Thus, the left side plate 2 and the right side plate 5 may be rotated synchronously to rotate to the second operation states. In this state, it is possible to push the left side plate 2 and the right side plate 5 to slide along the slideways so that the top plate may return to the same supporting position as a vertical position of a high position after moving from the high position to a low position. The above arrangement may be an embodiment of the above-mentioned fixing structure.

Similarly, the right side plate 5 may also be provided with right-side convex points which are matched with the right-side concave holes arranged on the right-side slideway 104 so that under a condition that the right side plate 5 moves to the first operation position, a limiting effect on the right side plate 5 may be formed.

The left-side convex point 204 and the left-side concave hole 103, and the right-side convex point and the right-side concave hole may be of clamping limiting structures, or inserting and elastic abutting structures.

In this embodiment, a mating structure is provided on each of the air guide hood body 1 and the left side plate 2, and a clamping connection is formed through the mating of the two to achieve limiting so that the function of fixing the left side plate 2 in the first operation position is achieved. Similarly, a mating structure is provided on each of the air guide hood body 1 and the right side plate 5, and a clamping connection is formed through the mating of the two to achieve limiting so that the function of fixing the right side plate in the first operation position is achieved. This ensures the stability of the left side plate 2 and the right side plate 5 and ensures the stability of the arrangement of the radiator.

It should be noted that the first operation position and the second operation position provided in the present application may be in various situations. A relatively reliable arrangement manner is that within movement ranges of the slideways, a position where the two slideways are relatively close is the first operation position, and a position where the two slideways are relatively far away is the second operation position. Under a condition that the left side plate 2 and the right side plate 5 are located at the first operation positions, they are relatively close, facilitating the formation of a trapezoidal bridge-like structure. Under a condition that the left side plate 2 and the right side plate 5 are located at the second operation positions, they are relatively far away, facilitating the formation of a planar structure. In some embodiments, other arrangement manners are within the scope of the present application under a condition that they may satisfy the conversion between the bridge-like structure and the planar structure.

On the basis of the above-mentioned embodiments, there are at least two left-side convex points 204 and at least two left-side concave holes 103, and/or there are at least two right-side convex points and at least two right-side concave holes.

It should be noted that the number of the left-side convex point 204 and the left-side concave hole 103 may be set according to an area of the left side plate 2, and the number of the right-side concave hole and the right-side convex point may be determined according to an area of the side plate and an area of the hole.

Under a condition that the left side plate 2 and the right side plate 5 are required to be provided horizontally, it is required to form a stable installation with the air guide hood body 1 and avoid instability caused by accidental sliding. Therefore, it is possible to form limiting arrangements with the air guide hood body 1 by providing limiting structures on the left side plate 2 and the right side plate 5.

On the basis of any one of the above-mentioned embodiments, one of the air guide hood body 1 and the left side plate 2 is arranged with a left-side pit 102, and the other is provided with a left-side boss 203 configured to be clamped with the left-side pits 102. Under a condition that the left side plate 2 is located at the corresponding second operation position and rotated to attach to the air guide hood body 1, the left-side pits 102 are clamped with the left-side bosses 203 to limit the sliding of the left side plate 2.

And/or one of the air guide hood body 1 and the right side plate 5 is arranged with right-side pits 105, and the other is provided with a right-side boss 503 configured to be clamped with the right-side pit 105. Under a condition that the right side plate 5 is located at the corresponding second operation position and rotated to attach to the air guide hood body 1, the right-side pit 105 is clamped with the right-side boss 503 to limit the sliding of the right side plate 5.

It should be noted that the left-side pits 102 may be arranged on the air guide hood body 1, and the left-side bosses 203 are provided on the left side plate 2. Positions of the left-side pits 102 and the left-side bosses 203 are matched, i.e., under a condition that the left side plate 2 is rotated to attach to the air guide hood body 1, the left-side pits 102 and the left-side bosses 203 are inserted or clamped, and a limiting direction thereof is to limit the movement of the left side plate 2 along the direction of the slideway.

The right-side pits 105 may be arranged on the air guide hood body 1, and the right-side bosses 503 are provided on the right side plate 5. Positions of the right-side pits 105 and the right-side bosses 503 are matched, i.e., under a condition that the right side plate 5 is rotated to attach to the air guide hood body 1, the right-side pits 105 and the right-side bosses 503 are inserted or clamped, and a limiting direction thereof is to limit the movement of the right side plate 5 along the direction of the slideway.

It should be noted that heights of the left-side boss 203 and the right-side boss 503 should not be too high to avoid affecting the rotation of the left side plate 2 and the right side plate 5.

Referring to FIGS. 6 and 7, the left-side boss 203 and the right-side boss 503 may be provided on plate surfaces of the side plates, close to the air guide hood body 1 to increase the reliability of sliding limiting while avoiding the influence on the rotation operations of the side plates.

Referring to FIGS. 6 and 7, there are at least two left-side pits 102 and at least two left-side bosses 203, and/or there are at least two right-side pits 105 and at least two right-side bosses 503.

It should be noted that the left-side bosses 203 and the right-side bosses 503 may be provided along a linear direction or in an array to enhance the stability of the connection.

In addition, a shape of the above-mentioned boss may be combined with the practice. For example, a circular boss or an elliptical boss is adopted.

The shape of the boss needs to match the shape of the pit, and the gap and the friction should not be too large, preventing the difficulty of turnover.

On the basis of any one of the above-mentioned embodiments, the top plate includes a left top plate 3 and a right top plate 4. The left top plate 3 and the right top plate 4 may be inserted or rotatably connected through a hinge shaft, and the two together form the top plate.

The top of the left side plate 2 is rotatably inserted into a left end of the left top plate 3, a right end of the left top plate 3 is inserted into a left end of the right top plate 4, and the top of the right side plate 5 is rotatably inserted into a right end of the right top plate 4.

That is, the left side plate 2, the left top plate 3, the right top plate 4, and the right side plate 5 from left to right are connected in sequence. The left side plate 2 and the left top plate 3 may rotate relative to each other, and the right top plate 4 and the right side plate 5 may rotate relative to each other. Thus, under a condition that the left side plate 2 and the right side plate 5 are controlled to move, the left top plate 3 and the right top plate 4 may be driven to move between the high position and the low position.

The left top plate 3 and the right top plate 4 may be inserted or hinged, but an additional angle restricting apparatus needs to be provided to avoid relative movement due to the hinging after the bridge-like structure is formed, which will eventually lead to the inability to carry the radiator. Thus, in some embodiments, the connection between the left top plate 3 and the right top plate 4 is insertion or other forms of fixed connection.

On the basis of the above-mentioned embodiments, the left side plate 2 is detachably rotatably inserted into the left top plate 3, the left top plate 3 is detachably inserted into the right top plate 4, and the right side plate 5 is detachably rotatably inserted into the right top plate 4.

It should be noted that for the solution provided by the present application, no dismantling is required to achieve the adjustment of the height position of the radiator. However, in this embodiment, detachable structures are chosen for the purpose of achieving a flexible adjustment in different situations, not just for achieving dismantling.

In addition, for the solution provided by the present application, under a condition that the left side plate 2, the left top plate 3, the right top plate 4, and the right side plate 5 are provided in a mutually detachable and connectable state, the flexibility of arrangement between various parts may be sufficiently ensured.

In some embodiments, for radiators of different sizes, it may be necessary for the bridge structures to have bridge floors of different widths to provide support, so the bridge floors may need to be replaced.

In an embodiment, the slideway of the above-mentioned height-adjustable server air guide hood includes at least one first operation position, i.e., a position where the left side plate 2 or the right side plate 5 may serve as a vertical support structure of the bridge, so as to adjust different spacings between the left side plate 2 and the right side plate 5. Meanwhile, on the basis of the above-mentioned description, the left side plate 2, the left top plate 3, the right top plate 4, and the right side plate 5 are provided in a mutually detachable state. Under a condition that the spacing between the left side plate 2 and the right side plate 5 is changed and located at another first operation position, the left side plate 2 and the right side plate 5 are still fixed in position through a corresponding fixing structure. At this time, top plates with different widths or lengths may be provided according to requirements to adjust an actual size of a supporting surface, thereby adapting to the requirements of the radiator in the current use state.

The above-mentioned arrangement requires the connection and cooperation between the left side plate 2, the left top plate 3, the right top plate 4, and the right side plate 5, so as to make full use of the air guide hood structure to the maximum extent and enhance the applicable extent thereof. In some embodiments, a setting interval, a fixing manner, etc. of two adjacent first operation positions may be determined with reference to the above description and according to practical requirements.

It should be noted that an angle between the right top plate 4 and the right side plate 5 is 90 degrees under a condition that supported as a bridge-like structure. Under a condition that the angle needs to be maintained and is not affected by a weight of the radiator, a corresponding fixing structure needs to be provided to enhance the angle. In this regard, a number of ways for fixing the angle may be selected, one of which is achieved with a stable triangular structure.

On the basis of the above-mentioned embodiments, the right top plate 4 is provided with a connecting rod 602 which is rotatable. A movable end of the connecting rod 602 is provided with the telescopic pin 601. The right side plate 5 is arranged with a first positioning hole 504, and the telescopic pin 601 is able to telescope relative to the connecting rod 602 and is inserted into the first positioning hole 504 to fix the right side plate 5 and the right top plate 4.

It should be noted that the connecting rod 602 is hinged to the right top plate 4, and an end of the connecting rod 602 is provided with the telescopic pin 601. The telescopic pin 601 may be a bolt or a screw provided in an end hole. During the relative rotation of the connecting rod 602, the screw may align with the first positioning hole 504 on the right side plate 5, and the screw enters the first positioning hole 504 through a twisting operation. At this time, the connecting rod 602, the right top plate 4, and the right side plate 5 form a stable triangular structure, thereby limiting the rotation of the right top plate 4 relative to the right side plate 5.

A rotating end of the connecting rod 602 is provided with a screw 603, and a horizontal position of the connecting rod 602 may also be changed by screwing the screw 603 outwards, so as to drive the connecting rod 602 to rotate. Under a condition that the telescopic pin 601 rotates to the first positioning hole 504, the screw 603 is screwed inwards again so that the telescopic pin 601 extends into the first positioning hole 504.

The above-mentioned structure may also be provided between the left side plate 2 and the left top plate 3 to form a limiting arrangement for an angle between the two plate members on the left side.

It should be noted that the above-mentioned arrangement is for fixing the angle between the two plate members as the bridge structure, but under a condition that the top plates, the left side plate 2, and the right side plate 5 are laid flat, the above-mentioned structure may be used for fixing.

On the basis of the above-mentioned embodiment, the right top plate 4 is arranged with a second positioning hole 401. The connecting rod is rotated to the second positioning hole 401, and the telescopic pin 601 may be inserted into the second positioning hole 401.

The second positioning hole 401 is arranged on the right top plate 4, and under a condition that the top plates, the left side plate 2, and the right side plate 5 are laid flat, the horizontal position of the connecting rod 602 may be changed by screwing the screw 603 outwards to control the rotation of the connecting rod 602. Under a condition that the telescopic pin 601 rotates to the second positioning hole 401, the screw 603 is screwed inwards again so that the telescopic pin 601 extends into the second positioning hole 401 to form a stable placement of the telescopic pin 601 in the second positioning hole, thereby preventing the connecting rod 602 from rotating due to an external force.

On the basis of the above-mentioned embodiments, each of the left side plate 2 and the right side plate 5 is provided with a hand-held structure, and the hand-held structure is located on an outer side of the bridge-like structure.

Referring to FIG. 1, each of the left side plate 2 and the right side plate 5 is provided with the hand-held structure. In some embodiments, the left side plate 2 is provided with a left-side hand-held structure 202, and the right side plate 5 is provided with a right-side hand-held structure 502, which are structures facilitating hand-held force application.

On the basis of the above-mentioned embodiments, the air guide hood body 1 is provided with at least two left side plates 2, at least two right side plates 5, and at least two top plates to form at least two bridge-like structures.

Referring to FIG. 1, a bridge-like structure is provided on each of the left and right sides of FIG. 1, and each structure has a left side plate 2, a right side plate 5, and top plates. Therefore, it may be understood that the support of the radiators and the addition of the supporting surfaces may be achieved by providing at least two bridge-like structures in addition to extending or increasing the width and length of the bridge surfaces.

The present application provides a height-adjustable server air guide hood, including the air guide hood body 1, the left side plates 2, the left top plates 3, the right top plates 4, the right side plates 5, and the positioning apparatuses 6.

The air guide hood body 1 is provided with the left-side slideway 101, and the left side plate 2 is placed in the left-side slideway 101 through the left-side convex pins 201 at two sides of the left side plate 2. The left side plate 2 is provided with the left-side hand-held structure 202 and may be pulled left and right as in FIG. 1 in the left-side slideway 101 through the left-side hand-held structure 202.

One side of the left-side slideway 101 of the air guide hood body 1 is arranged with a row of left-side pits 102 for controlling the stroke of the left side plate 2 and fixing the left side plate 2.

The bottom of the left side plate 2 is provided with corresponding left-side bosses 203. After the left side plate 2 slides to the end in the left-side slideway 101, the left side plate 2 may be placed across the air guide hood body 1, and the position of the left side plate 2 may be stabilized through the cooperation of the left-side bosses 203 and the left-side pits 102.

The other side of the left-side slideway 101 of the air guide hood body 1 is arranged with the left-side concave holes 103, and two ends of the left side plate 2 are provided with the left-side convex points 204. Under a condition that the left side plate 2 needs to be lifted, the left side plate 2 is controlled to rotate 90 degrees through the left-side hand-held structure 202, and the left side plate 2 is erected by controlling the cooperation of the left-side convex points 204 and the left-side concave holes 103.

The other end of the left side plate 2 is inserted into the left top plate 3, and the two may rotate through an inserting shaft. The other end of the left top plate 3 is inserted into the right top plate 4, and the two may rotate through an inserting shaft. The right side plate 5 is inserted into the other end of the right top plate 4, and the two may rotate through an inserting shaft.

The other end of the right side plate 5 is provided in the right-side slideway 104 through the right-side convex pins 501 at two sides of the right side plate 5. The right side plate 5 is provided with the right-side hand-held structure 502 and may be pulled left and right in the right-side slideway 104 through the right-side hand-held structure 502.

One side of the right-side slideway 104 corresponding to the right side plate 5 of the air guide hood body 1 is arranged with a row of right-side pits 105, and corresponding right-side bosses 503 are provided at the bottom of the right side plate 5. After the right side plate 5 slides to the end in the right-side slideway 104, the right side plate 5 is rotated. After the rotation, the movement is limited through the cooperation of the right-side bosses 503 and the right-side pits 105.

The positioning apparatus 6 includes the telescopic pin 601, the connecting rod 602, and the screw 603. The telescopic pin 601 is riveted on the connecting rod 602, and the other end of the connecting rod 602 is fixed on the right top plate 4 through the screw 603. A thread depth on the right top plate 4 is controlled, i.e., screwing the screw 603, to ensure that the connecting rod 602 may rotate through the screw 603.

The right top plate 4 is arranged with the second positioning hole 401 configured to install the telescopic pin 601, and under a condition that the height of the air guide hood needs to be reduced, the telescopic pin 601 is fixed in the second positioning hole 401 of the right top plate 4.

The right side plate 5 is arranged with the first positioning hole 504 for placing the telescopic pin 601. Under a condition that the right side plate 5 needs to be erected, it is necessary to rotate the telescopic pin 601 of the positioning apparatus 6 to the right side plate 5 side and place the telescopic pin 601 in the first positioning hole 504 of the right side plate 5, thereby completing the connection of the right side plate 5 and the right top plate 4 in a fixed angle.

For example, under a condition that the server air guide hood provided in the present application needs to adapt to a 2 U radiator, it is necessary to take out the left side plate 2 from the air guide hood body 1, then turn the left side plate 2 to keep it vertical, take out the right side plate 5 from the air guide hood body 1, keep the left top plate 3 and the right top plate 4 horizontal, and connect the four plates. Then, the positioning apparatus 6 is rotated to the right side plate 5, and the telescopic pin 601 is fixed into the first positioning hole 504 of the right side plate 5 so that a height adapting to the position of the 2 U radiator may be ensured.

Under a condition that the air guide hood needs to adapt to the 1 U radiator, the above-mentioned actions need to be reversed to return the above parts. Firstly, the telescopic pin of the positioning apparatus 6 is movably installed on the right top plate 4, and then the left side plate 2 is turned from the vertical state to the horizontal direction and returned in the horizontal direction. The left side plate 2 is fixed through the cooperation of the left-side bosses 203 of the left side plate 2 and the left-side pits 102 of the air guide hood body 1. At the same time, the right side plate 5 is returned in a manner consistent with that of the left side plate 2, and after the same operation, the whole is changed to a height of 1 U.

In addition to the structures of the components of the height-adjustable server air guide hood and the connection relationships therebetween provided in the above-mentioned embodiments, the present application also provides a server including the height-adjustable server air guide hood disclosed in the above-mentioned embodiments, and structures of other parts of the server are referred to the related art, and will not be described in detail herein.

Various embodiments are described in this specification in a progressive manner, with each embodiment focusing on differences from the other embodiments. The same and similar parts between the embodiments may refer to each other.

The height-adjustable server air guide hood and the server provided in the present application are described in detail above. The principle and embodiments of the present application have been described herein using examples, and the descriptions of the above embodiments are used to help understand the methods and core ideas of the present application. It should be noted that, for a person skilled in the art, several improvements and modifications may be made to the present application without departing from the principle of the present application, which also fall within the scope of the claims of the present application.

The invention claimed is:

1. A height-adjustable server air guide hood, comprising:
   an air guide hood body arranged with at least two sets of slideways, each of the at least two sets of slideways comprising a first operation position and a second operation position;
   a left side plate and a right side plate, wherein one side edge of both the left side plate and the right side plate is disposed in a corresponding slideway; under a condition that the left side plate and the right side plate are fixed in first operation positions of corresponding slideways, the left side plate and right side plate are disposed opposite to each other and are both perpendicular to the air guide hood body; under a condition that the left side plate and the right side plate are detached from the first operation positions and rotated to second operation positions of the corresponding slideways, the left side plate and right side plate are both attached to the air guide hood body; and
   a top plate, wherein two sides of the top plate are rotatably connected to a top of the left side plate and a top of the right side plate correspondingly so that the top plate is supported by the left side plate and the right side plate and is higher than the air guide hood body.

2. The height-adjustable server air guide hood according to claim 1, wherein at least one of:
   the left side plate is provided with two left-side convex pins, and the two left-side convex pins are located in a first set of the at least two sets of slideways; or
   the right side plate is provided with two right-side convex pins, and the two right-side convex pins are located in a second set of the at least two sets of slideways; and
   two sets of the at least two sets slideways are arranged in parallel.

3. The height-adjustable server air guide hood according to claim 2, wherein an inner side of the corresponding slideway is provided with an elongated side wall at a non-second operation position to limit rotation of the left side plate and the right side plate relative to the air guide hood body at the non-second operation position.

4. The height-adjustable server air guide hood according to claim 2, wherein
   at least one of the left-side convex pin or the right-side convex pin is a flat structure;
   a width of the corresponding slideway at the second operation position is greater than or equal to a maximum width of the flat structure; and
   a width of the corresponding slideway at a non-second operation position is less than the maximum width of the flat structure.

5. The height-adjustable server air guide hood according to claim 2, wherein at least one of:
   the left side plate is provided with a left-side hand-held structure; or
   the right side plate is provided with a right-side hand-held structure.

6. The height-adjustable server air guide hood according to claim 1, wherein at least one of:
   one of the air guide hood body or the left side plate is provided with a left-side convex point, and the other of the air guide hood body or the left side plate is arranged with a left-side concave hole; under a condition that the left side plate moves to a corresponding first operation position, the left-side convex point is inserted into the left-side concave hole to limit rotation and sliding of the left side plate; or
   one of the air guide hood body or the right side plate is provided with a right-side convex point, and the other of the air guide hood body or the right side plate is arranged with a right-side concave hole; under a condition that the right side plate moves to the corresponding first operation position, the right-side convex point is inserted into the right-side concave hole to limit rotation and sliding of the right side plate.

7. The height-adjustable server air guide hood according to claim 6, wherein at least one of:
   there are at least two left-side convex points and at least two left-side concave holes; or
   there are at least two right-side convex points and at least two right-side concave holes.

8. The height-adjustable server air guide hood according to claim 1, wherein at least one of:
   one of the air guide hood body or the left side plate is arranged with a left-side pit, and the other of the air guide hood body or the left side plate is provided with a left-side bosses configured to be clamped with the left-side pit; under a condition that the left side plate is located at a corresponding second operation position, the left-side pit is clamped with the left-side bosses to limit sliding of the left side plate; and/or
   one of the air guide hood body or the right side plate is arranged with a right-side pit, and the other of the air guide hood body or the right side plate is provided with a right-side bosses configured to be clamped with the right-side pit; under a condition that the right side plate is located at the corresponding second operation position, the right-side pit is clamped with the right-side bosses to limit sliding of the right side plate.

9. The height-adjustable server air guide hood according to claim 8, wherein at least one of:
   there are at least two left-side pits and at least two left-side bosses; and/or
   there are at least two right-side pits and at least two right-side bosses.

10. The height-adjustable server air guide hood according to claim 1, wherein the top plate comprises:
    a left top plate, wherein the left side plate is rotatably inserted into a left end of the left top plate; and
    a right top plate, wherein a right end of the left top plate is inserted into a left end of the right top plate, and the right side plate is rotatably inserted into a right end of the right top plate.

11. The height-adjustable server air guide hood according to claim 10, wherein
    the left side plate is detachably rotatably inserted into the left top plate;
    the left top plate is detachably inserted into the right top plate; and
    the right side plate is detachably rotatably inserted into the right top plate.

12. The height-adjustable server air guide hood according to claim 10, wherein an angle between the right side plate and the right top plate is 90 degrees.

13. The height-adjustable server air guide hood according to claim 10, further comprising positioning apparatuses, each of the positioning apparatuses being configured to fix an angle between the right side plate and the right top plate.

14. The height-adjustable server air guide hood according to claim 13, wherein
each of the positioning apparatuses comprises:
a connecting rod, wherein the right top plate is provided with the connecting rod which is rotatable; and
a telescopic pin, wherein a movable end of the connecting rod is provided with the telescopic pin; and
the right side plate is arranged with a first positioning hole;
wherein the telescopic pin is configured to telescope relative to the connecting rod and is inserted into the first positioning hole to fix the right side plate and the right top plate.

15. The height-adjustable server air guide hood according to claim 14, wherein the telescopic pin is riveted on the connecting rod.

16. The height-adjustable server air guide hood according to claim 14, wherein each of the positioning apparatuses further comprises:
a screw, wherein a second end of the connecting rod is fixed on the right top plate through the screw, and the connecting rod is rotated through the screw by screwing the screw.

17. The height-adjustable server air guide hood according to claim 14, wherein the right top plate is arranged with a second positioning hole; and under a condition that the connecting rod is rotated to the second positioning hole, the telescopic pin is inserted into the second positioning hole.

18. The height-adjustable server air guide hood according to claim 1, wherein both the left side plate and the right side plate are provided with a hand-held structure.

19. The height-adjustable server air guide hood according to claim 1, wherein the air guide hood body is provided with at least two left side plates, at least two right side plates, and at least two top plates.

20. A server, comprising an air guide hood, wherein the air guide hood comprises:
an air guide hood body arranged with at least two sets of slideways, each of the at least two sets of slideways comprising a first operation position and a second operation position;
a left side plate and a right side plate, wherein one side edge of the left side plate and right side plate is disposed in a corresponding slideway; under a condition that the left side plate and the right side plate are fixed in first operation positions of corresponding slideways, the left side plate and right side plate are disposed opposite to each other and are both perpendicular to the air guide hood body; under a condition that the left side plate and the right side plate are detached from the first operation positions and rotated to second operation positions of the corresponding slideways, the left side plate and right side plate are both attached to the air guide hood body; and
a top plate, wherein two sides of the top plate are rotatably connected to a top of the left side plate and a top of the right side plate correspondingly so that the top plate is supported by the left side plate and the right side plate and is higher than the air guide hood body.

* * * * *